(12) United States Patent
McGibney

(10) Patent No.: US 10,387,108 B2
(45) Date of Patent: Aug. 20, 2019

(54) METHOD, APPARATUS AND COMPUTER-READABLE MEDIA UTILIZING POSITIONAL INFORMATION TO DERIVE AGC OUTPUT PARAMETERS

(71) Applicant: Nureva, Inc., Calgary (CA)

(72) Inventor: Grant Howard McGibney, Calgary (CA)

(73) Assignee: Nureva, Inc. (CA)

( * ) Notice: Subject to any disclaimer, the term of this patent is extended or adjusted under 35 U.S.C. 154(b) by 0 days.

(21) Appl. No.: 15/603,986

(22) Filed: May 24, 2017

(65) Prior Publication Data
US 2018/0074782 A1 Mar. 15, 2018

Related U.S. Application Data

(60) Provisional application No. 62/393,461, filed on Sep. 12, 2016.

(51) Int. Cl.
*H03G 3/00* (2006.01)
*G06F 3/16* (2006.01)
(Continued)

(52) U.S. Cl.
CPC ............ *G06F 3/165* (2013.01); *H04R 1/406* (2013.01); *H04R 3/005* (2013.01); *H04R 5/027* (2013.01);
(Continued)

(58) Field of Classification Search
CPC ........ H04R 1/406; H04R 3/005; H04R 5/027; H04R 29/005; H04R 2201/401; H03G 3/32; H03G 3/24
(Continued)

(56) References Cited

U.S. PATENT DOCUMENTS

| 4,499,578 A | 2/1985 | Marouf et al. |
| 5,477,270 A | 12/1995 | Park |

(Continued)

OTHER PUBLICATIONS

Joseph Hector Dibiase, Thesis entitled, "A High-Accuracy, Low-Latency Technique for Talker Localization in Reverberant Environments Using Microphone Arrays", Brown University, May 2000.
(Continued)

*Primary Examiner* — Disler Paul
(74) *Attorney, Agent, or Firm* — Katten Muchin; Rosenman LLP

(57) ABSTRACT

Method and apparatus for automatic gain control utilizing sound source position information in a shared space having a plurality of microphones and a plurality of sound sources. Sound signals are received from the microphones. One or more processors locate position information corresponding to each of the sound sources. The processor(s) determine the distance to each of the sound sources from each of the microphones. The processor(s) define a predetermined gain weight adjustment for each of the microphones. The processor(s) apply the defined weight adjustments to the microphones to achieve a consistent volume of the desired plurality of sound sources. The processor(s) maintain a consistent ambient sound level regardless of the position of the sound sources and the applied gain weight adjustments. The processor(s) output a summed signal of the sound sources at a consistent volume with a constant ambient sound level across the plurality of sound source positions.

12 Claims, 6 Drawing Sheets

(51) Int. Cl.
  *H04R 1/40*    (2006.01)
  *H04R 3/00*    (2006.01)
  *H04R 5/027*   (2006.01)
  *H04R 29/00*   (2006.01)
  *H03G 3/32*    (2006.01)
  *H03G 3/24*    (2006.01)

(52) U.S. Cl.
  CPC ............ *H04R 29/005* (2013.01); *H03G 3/24* (2013.01); *H03G 3/32* (2013.01); *H04R 2201/401* (2013.01); *H04R 2201/403* (2013.01); *H04R 2430/01* (2013.01); *H04R 2430/23* (2013.01)

(58) Field of Classification Search
  USPC .............................. 381/104–109, 56–59, 92
  See application file for complete search history.

(56) References Cited

U.S. PATENT DOCUMENTS

| | | | |
|---|---|---|---|
| 6,912,718 B1 | 6/2005 | Chang et al. | |
| 7,130,705 B2 | 10/2006 | Amir et al. | |
| 7,848,531 B1 | 12/2010 | Vickers et al. | |
| 8,185,387 B1 | 5/2012 | Lachapelle | |
| 2006/0165242 A1* | 7/2006 | Miki | H04R 3/005 381/59 |
| 2008/0085014 A1 | 4/2008 | Chen et al. | |
| 2010/0135118 A1 | 6/2010 | Van Leest et al. | |
| 2012/0245933 A1* | 9/2012 | Flaks | G10L 21/0208 704/233 |
| 2013/0083934 A1* | 4/2013 | hgren | G10K 11/34 381/58 |
| 2013/0101134 A1 | 4/2013 | Betts-Lacroix | |
| 2014/0119552 A1 | 5/2014 | Beaucoup | |
| 2014/0133666 A1* | 5/2014 | Tanaka | H04R 3/00 381/66 |
| 2016/0071526 A1 | 3/2016 | Wingate et al. | |
| 2016/0173976 A1* | 6/2016 | Podhradsky | H04R 3/005 381/92 |

OTHER PUBLICATIONS

Transmittal; International Search Report; and Written Opinion of the International Searching Authority for International Application No. PCT/CA2017/050676, dated Oct. 12, 2017.

* cited by examiner

Fig 1 Microphone Array and AGC System Mapping

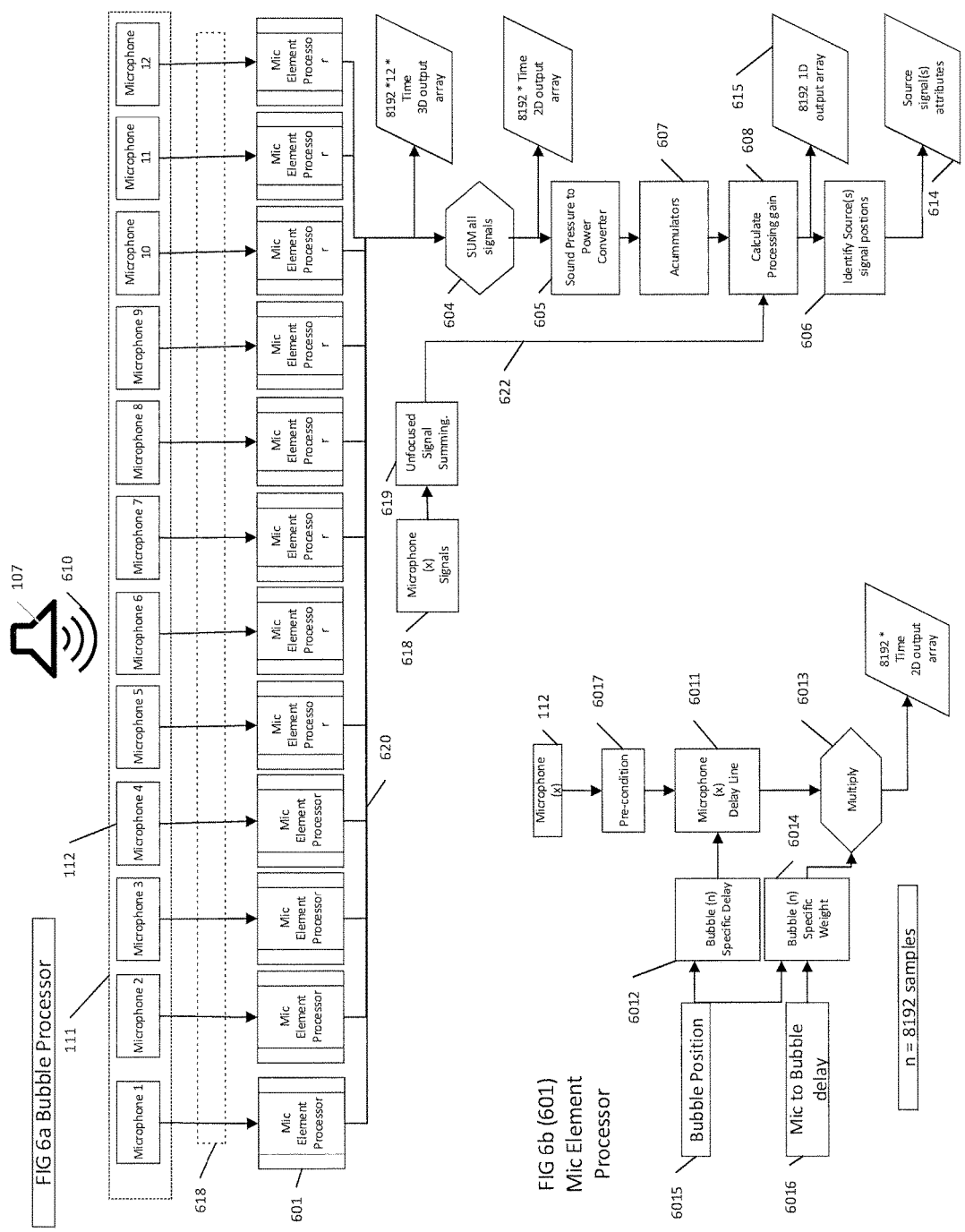

METHOD, APPARATUS AND COMPUTER-READABLE MEDIA UTILIZING POSITIONAL INFORMATION TO DERIVE AGC OUTPUT PARAMETERS

This application claims priority to U.S. Provisional Patent Application No. 62/393,461, filed Sep. 12, 2016, the entire contents of which are incorporated herein by reference.

BACKGROUND OF THE INVENTION

1. Field of the Invention

The present invention generally relates to utilizing positional 3D spatial sound power information for the purpose of deterministic automatic gain control to adjust a dynamically configured microphone array in at least near real-time for multi-user conference situations for optimum audio signal and ambient sound level performance.

2. Description of Related Art

Obtaining high quality audio at both ends of a conference call is difficult to manage due to, but not limited to, variable room dimensions, dynamic seating plans, roaming participants, unknown microphone locations, different microphone sensitivities, known steady state and unknown dynamic noise, and variable desired sound source levels. This results in audio sound sources having wide dynamic range within the ambient sound environment. Because of the complex needs and requirements, solving the problems has proven difficult and insufficient within the current art.

In the currently known art there have been various approaches to solving the complex issue of managing wide dynamic range audio signals with acceptable ambient sound level performance from multi-location based sound and signal sources. Typically, this is accomplished using heuristic-based automatic gain control techniques to enhance audio conferencing system performance in a multi-user room. Automatic gain control is used to bring the desired signal, which in this case may be but is not limited to a speaking participant in the room, to within an acceptable dynamic range to be transmitted to remote participants through third party telephone, network and/or teleconference software such as Microsoft Skype, for example. If automatic gain control was not implemented the conversations would be hard to hear with the sound volume levels swinging from very low level to very loud levels. The communication system may not be able to manage the signal properly, with too little signal strength to be heard clearly or too much signal strength, which would overdrive the system resulting in clipping of the signal and adding significant distortion. Either scenario would not be acceptable in an audio conference situation. If the signal is within a sufficient range to propagate through the system, the resulting dynamic range swings would require the remote participants to continually adjust their volume control to compensate for the widely variable level differences that would be present for each individual speaking participant. An unwanted byproduct of typical automatic gain control circuits is the ambient sound levels also tracking in proportion to volume changes by the remote participant.

Automatic gain control is typically applied as a post-processing function within a variable gain amplifier or after the analog digital converter in a digital signal processor isolated from the microphone processing logic. The automatic gain control does not know a key parameter such as the position of the sound source 103, which means the automatic gain control will need to operate on heuristic principals, assumptions, and configuration limits. This is problematic because the automatic gain control solutions have to work on heuristic principals because the actual location of the sound and ambient sound sources are not known, which means the performance of the automatic gain control is not deterministic. This results in serious shortcomings by not being able to adapt to and provide consistent performance and acceptable end user experiences. Automatic gain control systems which need to deal with large dynamic range signals end up having to adjust the gain of the system, which can show up as sharp unexpected changes in background ambient sound levels. The automatic gain control will appear to hunt for the right gain setting so there can be a warbling and inconsistent sound levels making it difficult to understand the person speaking. The automatic gain control is trying to normalize to preset parameters that may or may not be suitable to the actual situation, as designers cannot anticipate all scenarios and contingencies that an automatic gain control function must handle. Third party conference and phone software such as but not limited to Microsoft Skype, for example, have specifications that need to be met to guarantee compatibility, certifications, and consistent performance. Automatic gain controls in the current art do not know the distance and the actual sound levels of the sound source 104 (e.g., Participant 2 in FIG. 1) that they are trying to manage, resulting in inconsistent sound volume when switching sources and fluctuating ambient sound level performance. This makes for solutions that are not deterministic and do not provide a high level of audio performance and user experience.

Thus, the current art is not able to provide consistent performance in regards to a natural user experience regarding desired source signal level control and consistent ambient sound level performance.

An approach in the prior art is to utilize various methods to determine source location targeting parameters to determine Automatic Gain Control (AGC) settings. However, the systems in the prior art address a gain adjustment method that does not adequately manage the ambient noise levels to a consistent level, regardless of targeted AGC parameters, which is problematic for maintaining a natural audio listening experience with consistent ambient noise levels for conference participants.

U.S. Pat. No. 4,499,578 discloses multiport digital conference arrangements wherein speech samples of selected speakers are summed for distribution to the conferees. The embodiment controls the level of speech represented by information samples to be included in an output sample for distribution to the ports, and equalizes the speech level between speakers to reduce speech level contrast heard by the conferees. In addition, a speech detector for each port and microprocessor-controlled switching hardware also adjust the signal level represented by samples received on the ports to effect speaker selection. Furthermore, gain coefficients for a port may be incrementally adjusted during a predetermined period of time to avoid noticeable signal level changes when implementing speaker selection.

U.S. Pat. No. 7,130,705 discloses a system and method for automatically adjusting the gain of an audio system as a speaker's head moves relative to a microphone includes using a video of the speaker to determine an orientation of the speaker's head relative to the microphone and, hence, a gain adjust signal. The gain adjust signal is then applied to the audio system that is associated with the microphone to dynamically and continuously adjust the gain the audio system.

U.S. Pat. No. 8,185,387 describes methods and systems for adjusting audio gain levels for multi-talker audio. In one example, an audio system monitors an audio stream for the presence of a new talker. Upon identifying a new talker, the system determines whether the new talker is a first-time talker. For a first-time talker, the system executes a fast-attack/decay automatic gain control (AGC) algorithm to quickly determine a gain value for the first-time talker. The system additionally executes standard AGC techniques to refine the gain for the first-time talker while the first-time talker continues speaking. When a steady state within a decibel threshold is attained using standard AGC for the first-time talker, the system stores the steady state gain for the first-time talker to storage. Upon identifying a previously-identified talker, the system retrieves from storage the steady state gain for the talker and applies the steady state gain to the audio stream.

U.S. Pat. No. 5,477,270 describes using a camcorder which includes a camera section receiving a subject image subject through a zoom lens, converting the subject image to a video signal, and generating a corresponding wide/tele signal representing the position of the zoom lens, an audio processing part including a plurality of microphones receiving input sounds from the subject and converting the input sounds into a recordable audio signal, and a recorder/reproducer which records and reproduces the video signal and the recordable audio signal onto video tape. The audio processing part includes a plurality of analog elements. The audio processing part continuously amplifies the input audio signal using the analog elements in response to the wide/tele signal and outputs the recordable audio signal which corresponds to perceived distance from the camcorder to the subject. The analog elements may be transistors, wherein the dynamic resistance of each transistor is continuously varied responsive to the wide/tele signal.

U.S. Patent Application No. 2008/0085014 describes a gain adjusting system for adjusting a gain of a sound signal in an audio system, and includes a first detecting unit for capturing images of one or more faces of users and determining the number of faces and the size of the faces present in the images; a controller for receiving face data from the first detecting unit for comparing the sizes of faces in subsequently captured images with an initial face size and accordingly deciding and outputting a first decision signal; and a gain regulator coupled to the controller for adjusting the gain level of the sound signal according to the first decision signal.

U.S. Pat. No. 7,848,531 describes a method were the overall loudness of an audio track is calculated by combining a number of weighted loudness measures for segments of the audio track. The weight applied to each individual loudness measure is a function of the loudness measure. By comparing the original overall loudness measure to a desired overall loudness measure, a gain can be determined that will adjust the loudness level to the desired value. Also disclosed is a dynamic compression method that analyzes the dynamic characteristics of an audio track and determines appropriate compressor parameters. Additionally, the loudness of a post-compressor audio track can be estimated for any given compressor parameters, thus permitting post-compression loudness matching to be done even if the compression is performed in real-time.

SUMMARY OF THE INVENTION

An object of the present embodiments is to allow for a consistent volume of the sound source 104 no matter where it is located in the range of the system, while keeping the background ambient sounds at a constant level.

In one embodiment of the present invention, the dynamically measured position of the sound source (from a position processor or like process) is used.

Utilizing the positional coordinate information, a system having a Channel Audio Processor can calculate and control the individual microphone gain and selection of the microphone array utilizing derived repeatable gain values, based on known path loss calculations, to overcome the limitations of a heuristic post processing automatic gain control system. One advantage of this embodiment is that it operates deterministically and can use known sound pressure level propagation formulas over distance, to account for signal path loss situations on an individual basis, deriving the appropriate required gain adjustment for each sound source relative to the microphone array. Because the gain is preferably managed on an individual sound source location basis, the disadvantages of a broad-based automatic gain control circuit of the whole signal chain is not incurred, resulting in a consistent volume with stable ambient signal performance held to unity gain values, without the typical up and down normalizing and hunting that is typical of automatic gain control functions.

Typical solutions in the current art base the amplification or compression solely on the audio signal strength. This simple approach is subject to extreme ambient sound fluctuations. As the source signal goes down in level, the automatic gain control will increase the gain to compensate. This has the effect of bringing the relative ambient sound up as well. A natural extension of this is when there is no source signal present, the automatic gain control goes to max gain to bring up a signal that is not present, which greatly increases the ambient sound in the system. This situation is avoided within the presently preferred embodiments as there is preferably no controlling the gain compensation based on sound source level, but instead on position and path loss; if there is no sound source, the preferred embodiments will not artificially try and raise the ambient sound level. According to the preferred embodiments, there needs to be a signal present and located to derive the gain values.

The preferred embodiments comprise both algorithms and hardware accelerators to implement the structures and functions described herein.

According to a first aspect of the present invention, a method of automatic gain control utilizing sound source position information in a shared space having a plurality of microphones and a plurality of sound sources receives sound signals from the plurality of microphones. One or more processors is/are used to locate position information corresponding to each of the plurality of sound sources in the shared space. The one or more processors is/are used to determine the distance to each of the plurality of sound sources from each of the plurality of the microphones in the shared space, based on the position information. The one or more processors is/are also used to define a predetermined gain weight adjustment for each of the plurality of microphones, based on the distance information. The one or more processors is/are used to apply the defined plurality of gain weight adjustments to the plurality of microphones in order to achieve a consistent volume of the desired plurality of sound sources in the shared space. The one or more processors is/are used to maintain a consistent ambient sound level regardless of the position of the plurality of sound sources and the applied gain weight adjustments to the plurality of microphones, based on received signals from the plurality of microphones. And the one or more processors is/are used to output a summed signal of the plurality of sound sources at a consistent volume with a constant ambient sound level across the plurality of sound source positions in the shared space.

According to a second aspect of the present invention, apparatus balancing audio from an audio source in a multi-microphone array has at least one position processor receiving outputs from each of the microphones in the multi-microphone array, the outputs corresponding to a position of the audio source with respect to the multi-microphone array. At least one gain weight processor is coupled to the at least one position processor, and is configured to differently-weight signals from at least two of the microphones of the multi-microphone array, based on at least one output from the at least one position processor, in order to provide (i) substantially stable background sound level and (ii) substantially consistent sound level of the audio source.

BRIEF DESCRIPTION OF THE DRAWINGS

FIGS. 6a and 6b are respectively a hardware diagram and a software flowchart depicting processing gain.

DETAILED DESCRIPTION OF THE PRESENTLY PREFERRED EXEMPLARY EMBODIMENTS

Figure 1:
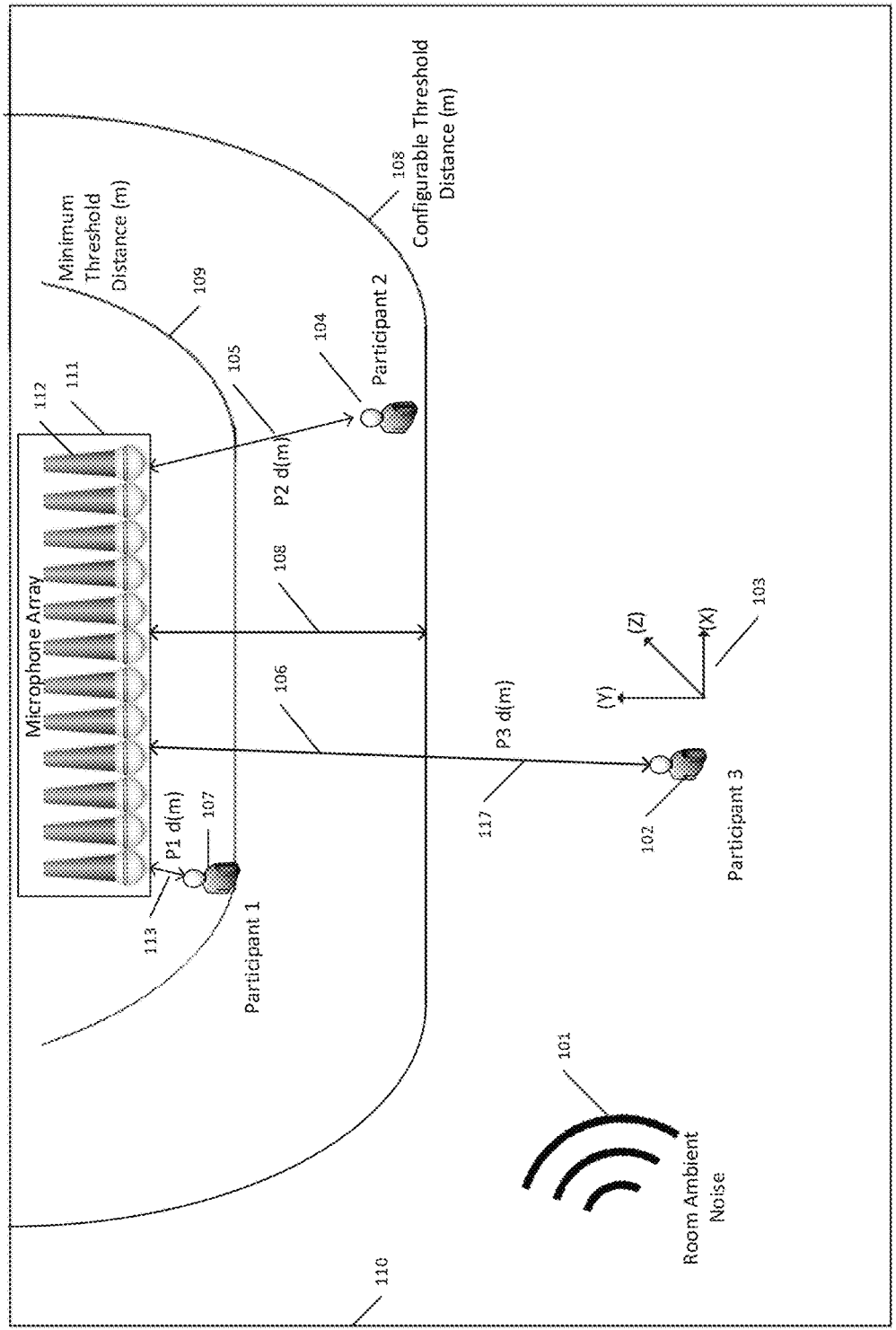
FIG. 1 is a diagrammatic illustration of the Gain Mapping Zones, according to the preferred embodiments.

The present invention is directed to apparatus and methods that enable groups of people (and other sound sources, for example, recordings, broadcast music, Internet sound, etc.), known as "participants", to join together over a network, such as the Internet or similar electronic channel(s), in a remotely-distributed real-time fashion employing personal computers, network workstations, and/or other similarly connected appliances, often without face-to-face contact, to engage in effective audio conference meetings that utilize large multi-user rooms (spaces) with distributed participants.

Advantageously, embodiments of the present apparatus and methods provide an ability to provide remote participants an end user experience having all sound sources at a consistent volume level, regardless of their location with respect to the microphone array, while maintaining consistent ambient sound and ambient sound source levels at all times.

A notable challenge to picking up sound clearly in a room, cabin, or confined space is the dynamic nature of the sound sources, resulting in a wide range of sound pressure levels, while maintaining realistic and consistent ambient sound levels for the remote participant(s).

A "device" in this specification may include, but is not limited to, one or more of, or any combination of processing device(s) such as, a cell phone, a Personal Digital Assistant, a smart watch or other body-borne device (e.g., glasses, pendants, rings, etc.), a personal computer, a laptop, a pad, a cloud-access device, a white board, and/or any device capable of sending/receiving messages to/from a local area network or a wide area network (e.g., the Internet), such as devices embedded in cars, trucks, aircraft, household appliances (refrigerators, stoves, thermostats, lights, electrical control circuits, the Internet of Things, etc.).

An "engine" is preferably a program that performs a core function for other programs. An engine can be a central or focal program in an operating system, subsystem, or application program that coordinates the overall operation of other programs. It is also used to describe a special-purpose program containing an algorithm that can sometimes be changed. The best known usage is the term search engine which uses an algorithm to search an index of topics given a search argument. An engine is preferably designed so that its approach to searching an index, for example, can be changed to reflect new rules for finding and prioritizing matches in the index. In artificial intelligence, for another example, the program that uses rules of logic to derive output from a knowledge base is called an inference engine.

As used herein, a "server" may comprise one or more processors, one or more Random Access Memories (RAM), one or more Read Only Memories (ROM), one or more user interfaces, such as display(s), keyboard(s), mouse/mice, etc. A server is preferably apparatus that provides functionality for other computer programs or devices, called "clients." This architecture is called the client-server model, and a single overall computation is typically distributed across multiple processes or devices. Servers can provide various functionalities, often called "services", such as sharing data or resources among multiple clients, or performing computation for a client. A single server can serve multiple clients, and a single client can use multiple servers. A client process may run on the same device or may connect over a network to a server on a different device. Typical servers are database servers, file servers, mail servers, print servers, web servers, game servers, application servers, and chat servers. The servers discussed in this specification may include one or more of the above, sharing functionality as appropriate. Client-server systems are most frequently implemented by (and often identified with) the request-response model: a client sends a request to the server, which performs some action and sends a response back to the client, typically with a result or acknowledgement. Designating a computer as "server-class hardware" implies that it is specialized for running servers on it. This often implies that it is more powerful and reliable than standard personal computers, but alternatively, large computing clusters may be composed of many relatively simple, replaceable server components.

The servers and devices in this specification typically use the one or more processors to run one or more stored "computer programs" and/or non-transitory "computer-readable media" to cause the device and/or server(s) to perform the functions recited herein. The media may include Compact Discs, DVDs, ROM, RAM, solid-state memory, or any other storage device capable of storing the one or more computer programs.

FIG. 1 illustrates a room 110 with a microphone array 111, which comprises a plurality of microphones 112. This diagram illustrates the various configuration zones that are available for the microphone array 111.

For the purpose of this embodiment, the microphone array 111 is positioned against a wall; however the position of the microphone array 111 can be against any wall in the room 110. There are notionally three participants illustrated in the room, Participant 1 107, Participant 2 104 and Participant 3 102. Participant(s) and sound source(s) can and will be used interchangeably and in this context mean substantially the same thing. Each Participant illustrates, but is not limited to, an example of the variability of position 103 within a room 110. The embodiments are designed to adjust for and accommodate such positions (stationary and/or moving). For example, each Participant may be moving, and thus have varying location coordinates in the X, Y, and Z directions. Also illustrated is an ambient sound 101, which may be present and propagated throughout the room, such that it is relatively constant for each participant 107, 104, 102 locations. For example, the room ambient noise may be one or more of HVAC noise, TV noise, outside noise, etc.

Also illustrated in FIG. 1 is a Minimum Threshold Distance (MTD) 109 and a Configurable Threshold Distance (CTD) 108. The area inside the CTD 108 is the microphone array 111 configuration zone. In that zone, utilizing the specific distance P2 d(m) (e.g., distance in metric) 105 of the participant 2 104, the array will be configured for individual gain and microphone selection to stabilize the array 111 volume output and ambient sound level 101 relative to the Participant 2 location 104. Within the CTD 108 there is preferably enough positional 103 resolution of the system to utilize distance path loss 105 to tune the array 111 for individual microphone 112 gain-weighted measurements. Within the zone of the CTD 108 and the MTD 109, the microphone array 111 is dynamically configured to utilize between 1-12 of the microphones 112, based on the position 103 of the sound source 104.

For participants 102 outside the CTD 108, preferably all microphones 111 are used. As the sound source 104 gets further from the CTD 108, its perceived volume will drop off. This is the preferred behavior as it may be undesirable to pick up people far away and have them sound as if they are in the room.

For participants 104 in the zone between the MTD 109 and the CTD 108, the system will preferably pick the n+1 microphones 112 which are closest to the location 103 of the sound source 104 to act as the microphone array (e.g., one of them will only be fractionally on) and the remainder are preferably turned off.

When a participant 107 is within the MTD 109, the system will preferably select a pair of microphones 112 in the array 111, so that the ambient sound level 101 can be maintained with one microphone 112 fully on and one fractionally on, e.g., 5%, 10%, 15%, 20%, 25%, 30%, 35%, 40%, 45%, 50%, or any value between 1% and 99%. When the participant 107 gets within the MTD of the closest microphone, the array will preferably no longer use that microphone. Instead, the system preferably uses one or more other microphones further away, that are outside the closest-microphone MTD in order to control the gain of the sound source 104. If the microphones are spaced close enough, there will usually exist a microphone in the range where n=1. The maximum microphone spacing allowed is preferably (sqrt(2)−1)*MTD.

Beyond the CTD 108, all 12 microphones (or however many microphones are in the array, e.g., any number between 2 and 100; and the "array" may be a one-dimensional array, a two-dimensional matrix array, or a three-dimensional linear or matrix array having certain microphones at different distances from a Z-axis baseline) 112 of the microphone array 111 are preferably sequentially enabled as the positional information 103 (obtained from the system) becomes too granular and the best performance is realized with all 12 microphones in operation. Both the MTD 109 and the CTD 108 are preferably system-configurable parameters that are set based on the microphone array 111 parameters and the room 110 parameters.

Figure 2:
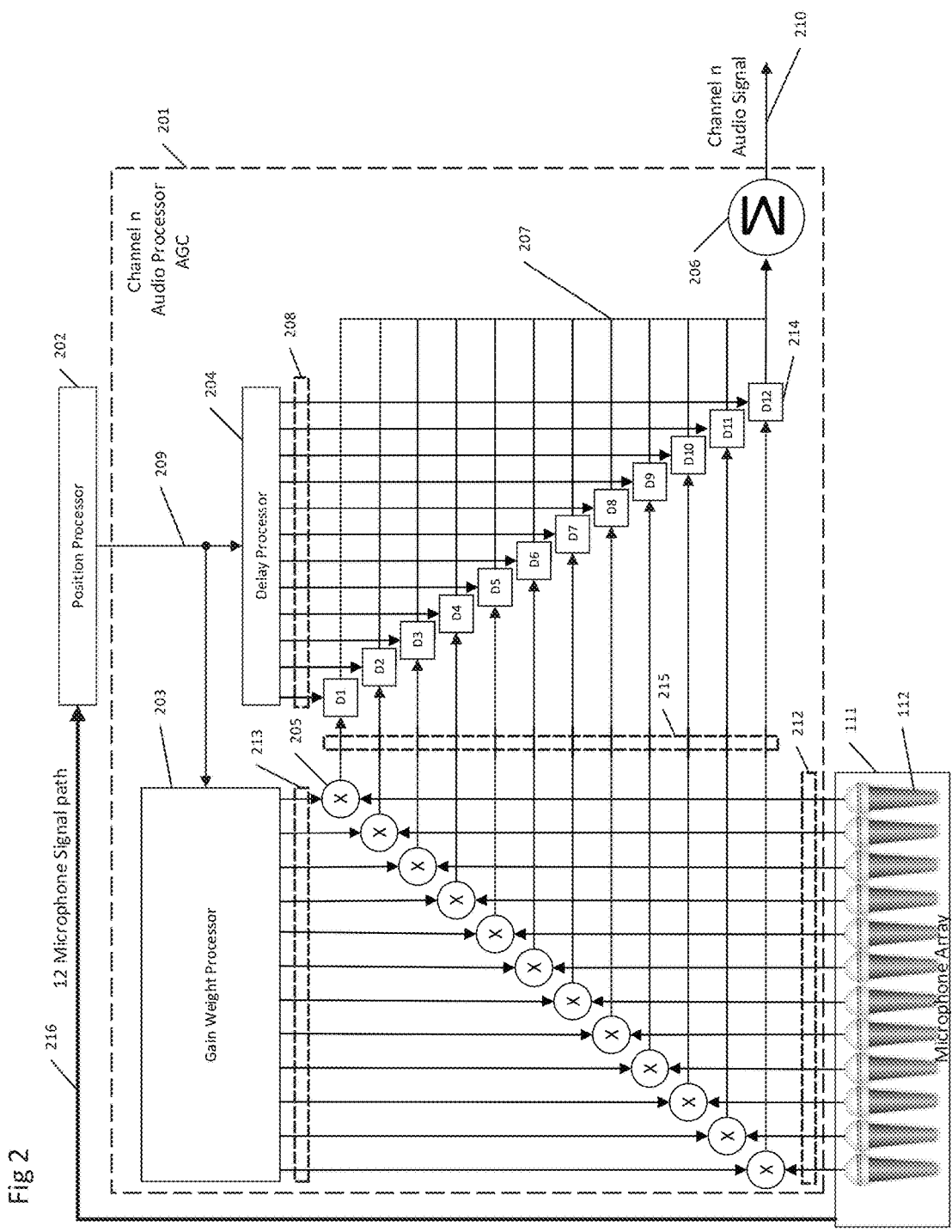
FIG. 2 is a diagrammatic illustration of Automatic Gain Control Channel Processor, according to the preferred embodiments.

FIG. 2 illustrates the system Position Processor 202 and the automatic gain control Channel Processor 201. Although one Channel Processor 201 is shown the embodiments, the implementation may utilize a plurality of channel processors 201, resulting in multiple audio channels 210 with individual microphone array 111 gain control capabilities running in parallel. This allows for unique microphone array tunings for each sound source 104 position 107, 104, 102 with known positional coordinates 103. Each Channel Audio Processor preferably includes at least one Gain Weight Processor 203 and at least one Delay Processor 204. Each "processor" may comprise one or more processor chips or boards, which may be co-located or remotely located with respect to each other. The presently preferred embodiments contemplate at least one Field Programmable Gate Array (FPGA) as the Position Processor 202, and a Digital Signal Processor (DSP) as the Gain Weight Processor 203. However, these processors may comprise one or more circuits and/or applications installed in one or more personal computers and/or Application Specific Integrated Circuits (ASICs). These processors may run program code permanently stored therein or stored in removable media. The program code preferably comprises one or more modules and/or engines to perform the various functions described herein.

FIG. 2 shows a microphone array 112 (comprising a plurality of microphones 111) which is connected to a Position Processor 202. One embodiment may comprise the processor described and depicted in U.S. Provisional Appln. No. 62/343,512, filed May 31, 2016, BUBBLE PROCESSOR, the entire contents of which are incorporated herein by reference. See also U.S. Provisional Appln. No. 62/162,091, filed May 15, 2015, A SYSTEM FOR PROCESSING AUDIO; U.S. Provisional Appln. No. 62/345,208, filed Jun. 3, 2016, VIRTUAL POSITIONING IN A SOUND SPACE, the entire contents of both of which are incorporated herein by reference).

The Position Processor 202 utilizing the Microphone Array signals 216 preferably determines the substantially exact positional location 103 (X,Y,Z) coordinates of the sound source 104 with the highest processing gain. This is the sound source 104 that the microphone array will focus on. The Position Processor 202 preferably runs independent of the Channel Processor 201. The Position Processor 202 preferably communicates the positional information 209 to the Channel Processor 201, which comprises the Delay Processor 204 and the Gain Weight Processor 203. The Channel Processor preferably runs at the required sample rates (e.g., 24 kHz) to support the desired frequency response specifications, meaning the sample rates are not limited by the invention implementation in the embodiments.

The sound pressure level (SPL) of the sound wave follows a very predictable loss pattern where the SPL is inversely proportional to the distance P2 d(m) 105 from the source Participant 2 104 to the microphone array 111. Since the positional information 209 derived from the Position Processor 202 is known, the distance P2 d(m) 105 can be calculated, and the Gain Weight Processor calculates the gain required, on a per microphone 112 basis, based on the distance 105 to each microphone 112 of the microphone array 111. Once the Gain Weight parameters 213 Alpha (α=the multiplication factor to be applied to each of the fully-on microphone signals. Fα=the multiplication factor to be applied to the fractionally-on microphone signal (f is preferably a value between 0 and 1)); and the f*Alpha parameters have been calculated, they are multiplied 205 with the individual Microphone 112 signals 212, resulting in weighted output parameters 215 that have been gain-compensated based on the actual distance 105 from the microphone 112 in the microphone array 111. This process accomplishes the specific automatic gain control function, which adjusts the microphone levels 215 that are preferably sent to the delay elements.

The delays in the microphone array 111 are calculated using the positional information 209 from the Position Processor 202 in the Delay Processor 204. The Delay Processor 204 preferably calculates the individual path loss delays d(m) in milliseconds for each microphone 112 relative to the sound source 104 location 103. It then preferably adds the extra DELAY into each microphone path of D-d(m) so that the overall DELAY between the sound source 104 and the summer 206 through all the microphone paths is preferably a constant D. The value constant D would typically be the delay through the longest path between a microphone 112 and a position monitored by the position processor 202, measured in milliseconds. For example if the longest distance between the 12 antennas and the 8192 points monitored by the position processor is 10 m, then then the value of D would be that distance converted into a delay, about 30 ms. The result is that signals from all microphones 112 are aligned in the time domain, allowing for maximum natural gain of all direct signal path signals to the microphone array 111. All of the output signals 216 are preferably summed at the Summer 206 and output for further system processing. The resulting delays are applied to all of the microphones whether they will be used by the Gain Weight Processor 203 or not.

To provide gain control of the desired signal without affecting the ambient sound level is preferably accomplished through the following methods. This is accomplished by controlling the processing gain of the microphone array 112. Processing gain is how much the array 112 boosts the desired signal source relative to the undesired signal sources. As illustrated with a linear microphone array 111, the processing gain is roughly the square root of the number of microphones in use ($\sqrt{12}$=3.46 if we use all 12 microphones). When it is desired to reduce the volume of the focused signal without affecting ambient levels 101, the microphones 112 in the array 111 are turned off to reduce the gain and provide the proper scaling constants to keep the ambient sounds 101 at the same level. For example, if half the microphones are turned off, the gain drops to $\sqrt{6}$=2.45, or a 3 dB drop from 12 microphones.

In this embodiment, the maximum gain that can be achieved with all 12 microphones is 3.46, and the minimum gain (when reduced to a single microphone) is 1. This gives a 10.8 dB gain range. The CTD 108 is preferably where to set the desired signal levels with all 12 microphones 112 on. Below the CTD 108, the microphones in the array 111 are preferably individually turned off to maintain a consistent sound level. Beyond the CTD 108, the system typically cannot produce more gain, so the sound level will drop off with the inverse distance law.

To optimize the implementation embodiments, it is not preferred to just switch microphones 112 in and out, since this may cause undesirable jumps in the sound volume. To make the adjustments continuous, it is preferable to assign some number of microphones 112 to be fully turned on and one microphone 112 to be partially turned on. The partially turned-on microphone 112 allows a smooth transition from one set of microphone(s) to another, and to implement any arbitrary gain within the limits.

Calculation of microphone gain parameters. It is preferred to determine a specific gain, $G_{focus}$, for the focused signal while keeping the background gain, $G_{bg}$, at unity. To do this, it is preferred to turn n microphones 112 on fully and have one microphone 112 on fractionally with a constant f that is somewhere between 0 and 1. Each microphone signal is preferably weighted by the common constant $\alpha$. Given the assumptions that the background signals are orthogonal so they add by power when combined, and that the levels of the signals arriving at each microphone 112 are equal, the rms gain of n signal with a gain of a and one signal with a gain of f$\alpha$ is:

$$G_{bg}=\alpha\sqrt{n+f^2} \qquad (1)$$

Setting $G_{bg}$ to unity to keep it constant gives:

$$\alpha=1/\sqrt{n+f^2} \qquad (2)$$

The array 111 is designed to combine the focused source coherently so the signals from this source add by amplitude. The coherent gain of the focused source is:

$$G_{focus}=\alpha(n+f) \qquad (3)$$

Substituting (2) into (3) gives:

$$G_{focus} = \frac{n+f}{\sqrt{n+f^2}} \qquad (4)$$

For a given $G_{focus}$, first assume that f=0 and find the largest integer n that give a result less than or equal to $G_{focus}$ $$n=\text{floor}(G_{focus}^2) \qquad (5)$$

Then solve for f $$G_{focus}\sqrt{n+f^2}=n+f \qquad (6)$$

$$G_{focus}^2(n+f^2)=n^2+2nf+f^2 \qquad (7)$$

$$(G_{focus}^2-1)f^2-2nf+(G_{focus}^2 n-n^2)=0 \qquad (8)$$

Equation (8) can be solved for f using the standard quadratic equation and picking the solution where 0≤f<1. Then compute a from equation (2).

The logic flow is as follows:
Gm is the maximum gain of the array (Gm=sqrt(number of microphones))
Dc is the configurable threshold distance 108
Dm is the minimum threshold distance 109 where the array gain is unity (Dm=Dc/Gm)
Use sound source 104 location (x,y) 103 and the known microphone 112 locations to determine the distance to the closest microphone (d) 117
If d>Dc
Set n=number of microphones
Set f=0
calculate the weight factor, alpha, and apply it to all microphones.
else if (Dm<d<Dc)
calculate the desired processing gain to compensate for path loss G=Gm*d/Dc
calculate number of full gain microphones, n, required to achieve desired gain
calculate fractional amount for the additional microphone, f
calculate the weight factor, alpha calculate the gain for each individual microphone (zero for unused microphone, alpha for full on, and f*alpha for fractionally on)

choose the n+1 closest microphone(s) to the sound source 104 to use in the array (the furthest is the fractional microphone)

else if d<minimum threshold distance recalculate d for the closest microphone that is greater than Dm from the sound source 104, this will be on full (if microphones are placed close enough together then n=1 automatically)

choose the next furthest microphone to act as the fractional microphone calculate the fractional amount, f calculate the weight factor alpha calculate the gain for each individual microphone (zero for unused microphone, alpha for full on, and f*alpha for fractionally on)

Figure 3:
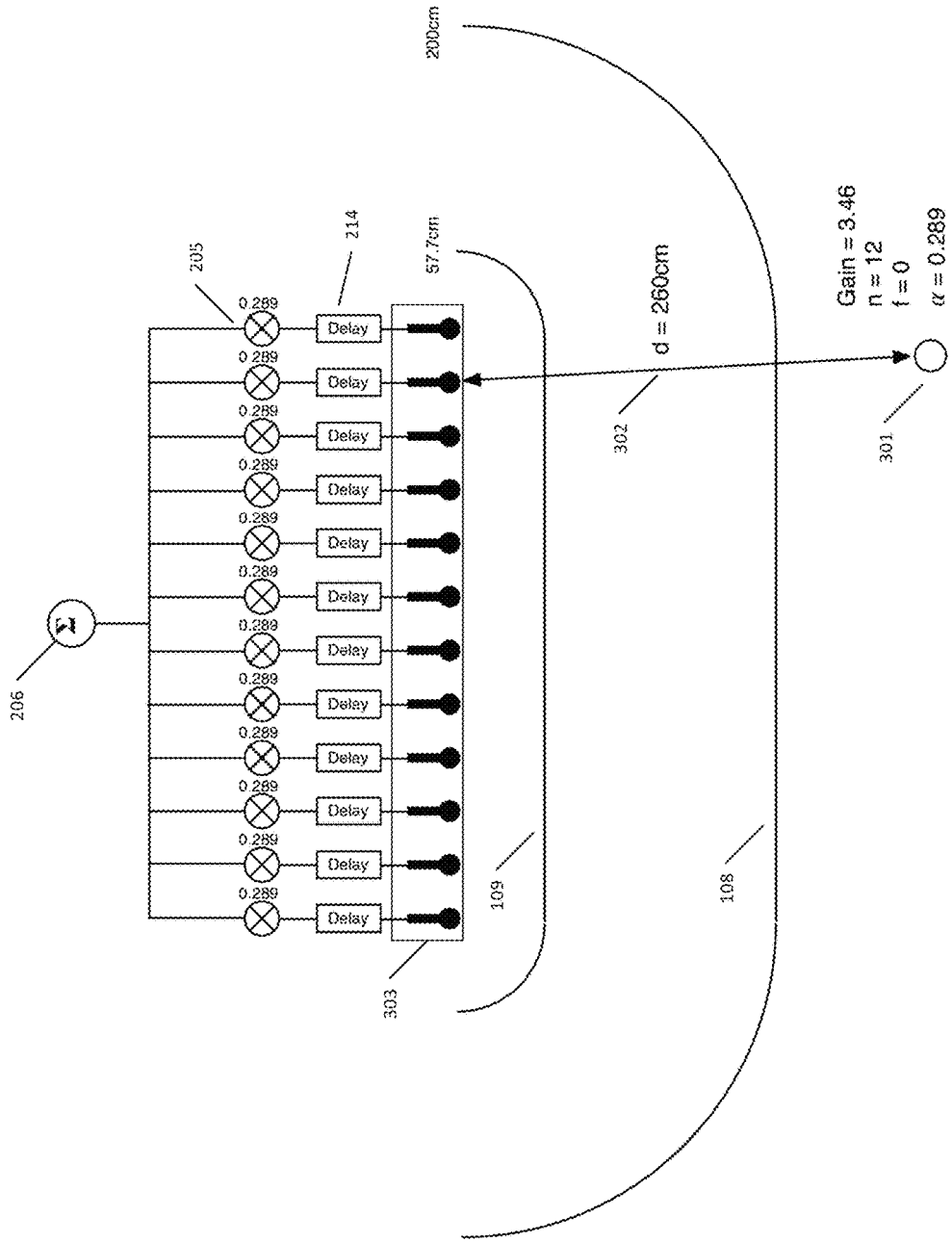
FIG. 3 is a diagrammatic example of the Automatic Gain Control calculation with a participant outside of the Configurable Threshold Distance.

FIG. 3 illustrates the microphone arrangement 303 and the gain weight values a when a participant 301 is located outside of the CTD 108. The Figure shows a preferred structure (one or more circuits) comprising the microphone arrangement 303, Gain Weight Multipliers 205, and the Summer 206. The MTD 109 for this embodiment has been set to 57.7 cm, and the CTD has been set to 200 cm. The position of the participant 301 has been determined by the Position Processor 202, and the Gain Weight Processor 203 has determined the distance 302 to be 260 cm. This positions the participant 301 outside of the CTD 108. Based on the embodiment calculations per the above discussion, the calculated Gain Value used to set the Channel Processor AGC 201 to is 3.64 in this embodiment. All microphones 303 are enabled, n=12, and the per microphone α gain value is 0.289. Since all microphones 303 are fully enabled there is no fractional gain value and f=0.

Figure 4:
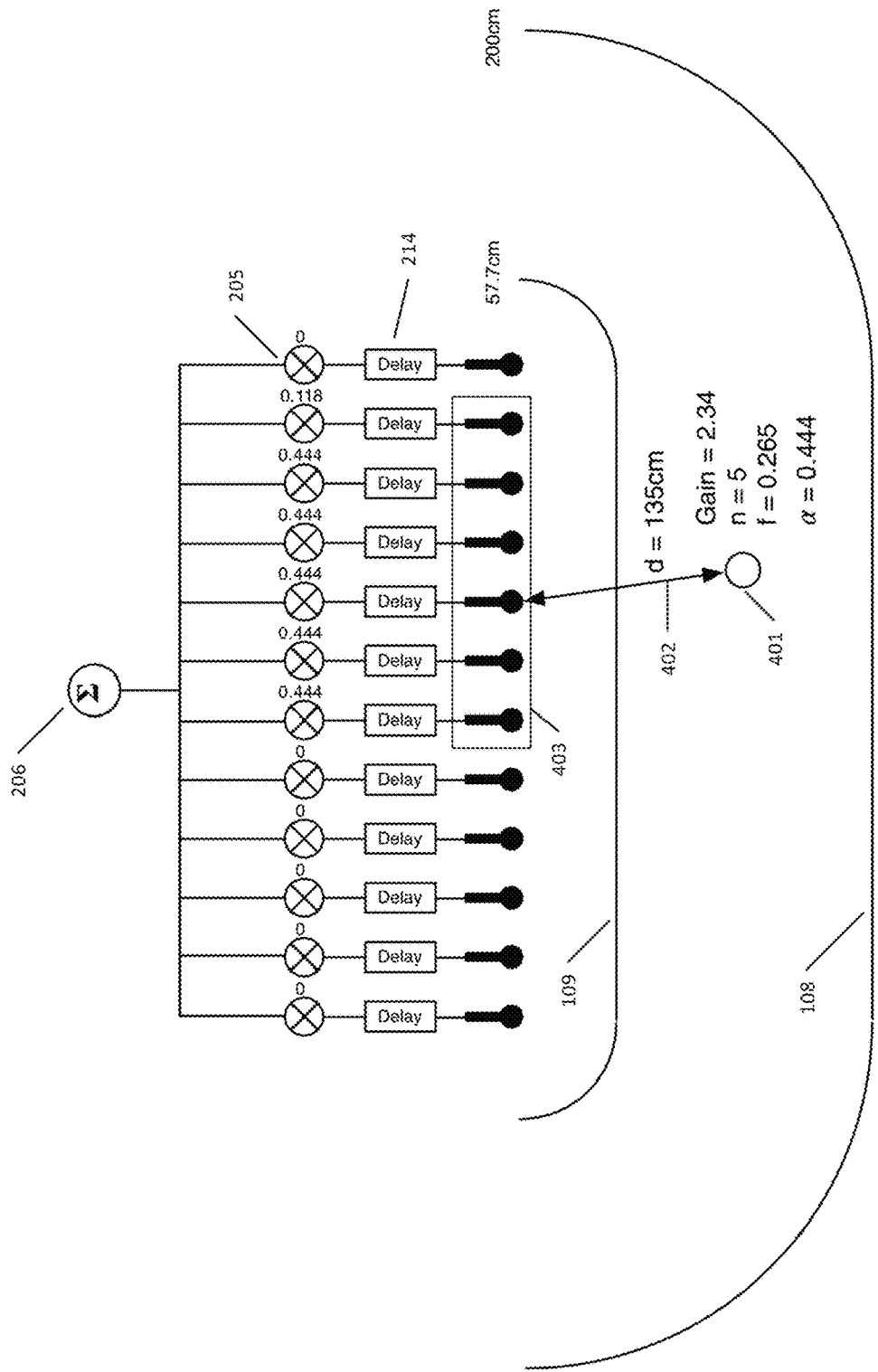
FIG. 4 is a diagrammatic example of the Automatic Gain Control calculation with a participant inside of the Configurable Threshold Distance.

FIG. 4 illustrates the microphone arrangement 403 and gain weight values a when a participant 401 is located inside of the CTD 108 but not within the MTD 109. The Figure shows the circuit comprising the microphone arrangement 403, Gain Weight Multipliers 205, and the Summer 206. The MTD 109 has been set to 57.7 cm in this embodiment, and the CTD has been set to 200 cm. The position of the participant 401 has been determined by the Position Processor 202, and the Gain Weight Processor 203 has determined the distance 402 to be 135 cm in this embodiment. This positions the participant 401 within the CTD 108. Based on the calculations described above, the calculated Gain Value used in this embodiment to set the Channel Processor AGC 201 to is 2.3. Preferably, only some of the microphones 403 are enabled, n=5, and the per microphone α gain value is 0.444. One Microphone is partially turned on with a fractional value of f=0.265. The microphone(s) 403 selected are based on the closest proximity to the participant 401.

Figure 5:
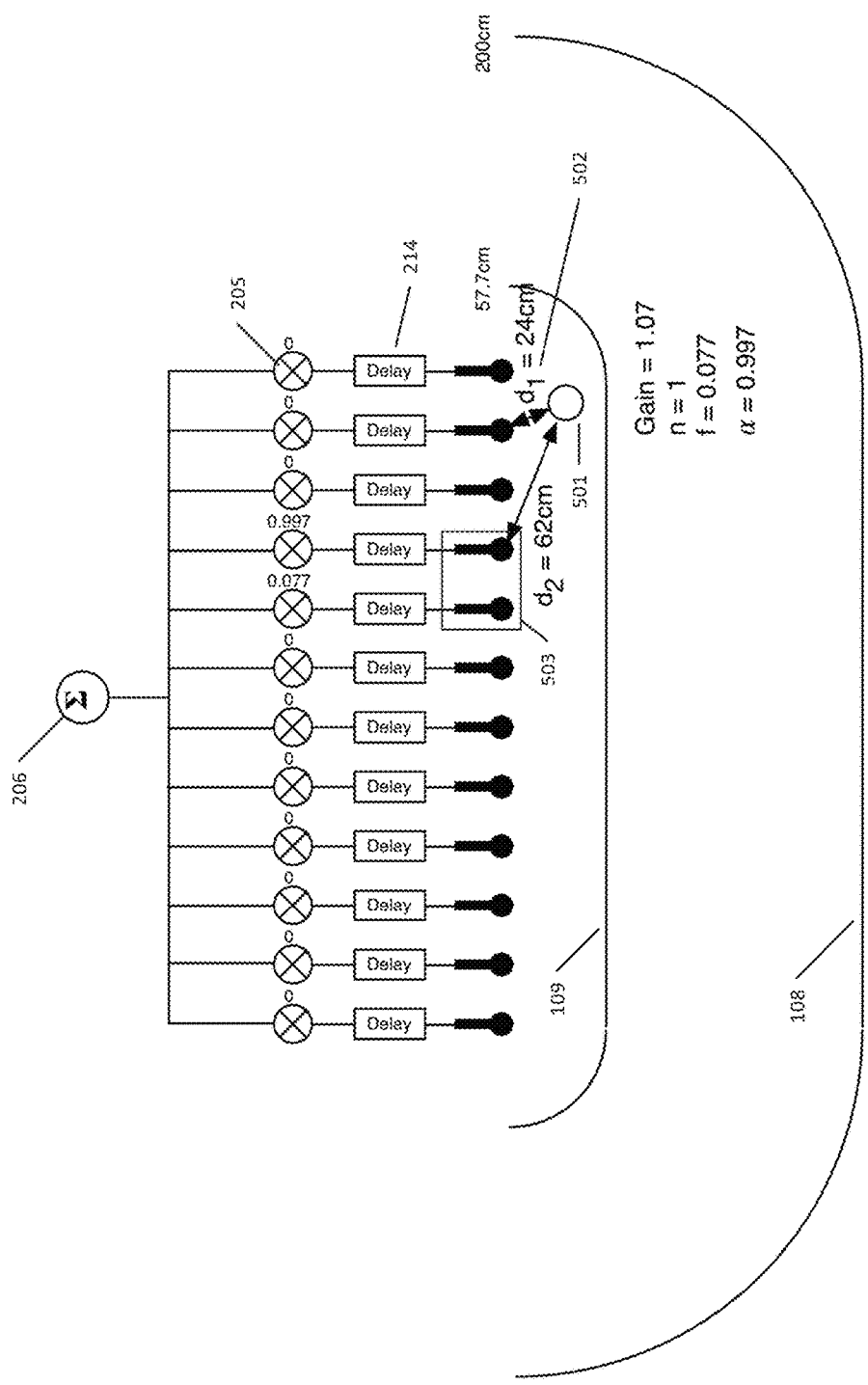
FIG. 5 is a diagrammatic example of the Automatic Gain Control calculation with a participant inside of the Minimum Threshold Distance.

FIG. 5 illustrates the microphone arrangement 503 and gain weight values a when a participant 501 is located inside of the MTD 109. The Figure shows the circuit comprising the microphone arrangement 503, Gain weight multipliers 205, and the Summer 206. The MTD 109 has been set to 57.7 cm and the CTD has been set to 200 cm. The position of the participant 501 has been determined by the Position Processor 202, and the Gain Weight Processor 203 has determined the distance 502 to be 24 cm in this embodiment. This positions the participant 501 within the CTD 108. As this distance may be too close for the system to control the gain, a microphone further from the source (e.g., 62 cm) is selected to be the primary on microphone. Based on the calculations described earlier, the calculated Gain Value required to set the Channel Processor AGC 201 to is 1.07 in this embodiment. Only some of the microphones 503 are enabled, n=1, and the per microphone a gain value is 0.997. One microphone is partially turned on with a fractional value of f=0.077. The microphone(s) 503 are selected based on determining the microphones 503 that are located outside of a distance equal to the MTD 109. In this embodiment, the microphone(s) 503 selected are 62 cm away from the participant, which is a distance greater than the MTD109 of 57.7 cm.

FIG. 6a illustrates a flow chart outlining the logic to derive the processing gain to identify the position of the sound source 107. The purpose of the system is to create an improved sound output signal 615 by combining the inputs from the individual microphone elements in the array in a way that increases the magnitude of the direct sound 610 received at the microphone array relative to the reverb and noise components. If the magnitude of the direct signal 610 is doubled relative to the reverb and noise signals, it will have roughly the same effect as halving the distance between the microphones 112 and the sound source 107. The signal strength when the array is focused on a sound source 107 divided by the signal strength when the array is not focused on any sound source 107 (such as ambient background noise, for example) is defined as the processing gain of the system. The system preferably sets up thousands of listening positions within the room and simultaneously measures the processing gain at each of these locations. The virtual listening position with the largest processing gain is substantially the location of the sound source 107. Of course, the processing of these flowcharts may be performed in any of the devices, servers, computers, FPGAs, DSPs, and/or ASICs described above.

To derive the processing gains 608, the volume of the room where sound pickup is desired is preferably divided into a large number of virtual microphone positions. When the array is focused on a given virtual microphone, then any sound source within a close proximity of that location will produce an increased processing gain at that virtual microphone. The volume around each virtual microphone in which a sound source will produce maximum processing gain at that point, may be defined as a bubble. Based on the location of each microphone and the defined 3D location for each virtual microphone, and using the speed of sound which can be calculated given the current measured room temperature, the system can determine the expected propagation delay from each virtual microphone to each microphone array element 112.

The flow chart in FIG. 6b illustrates the signal flow within the processing unit. This example monitors 8192 bubbles simultaneously. The sound from each microphone element 112 is sampled at the same time as the other elements within the microphone array 111 and at a fixed rate of 12 kHz. Each sample is preferably passed to a microphone element processor 601. The microphone element processor 601 preferably conditions and aligns the signals in time and weights the amplitude of each sample so they can be passed on to the summing node 604.

The signal components 620 from the microphones element processors 601 are preferably summed at node 604 to provide the combined microphone array signal for each of the 8192 bubbles. Each bubble signal is preferably converted into a power signal at node 605 by squaring the signal samples. The power signals are then summed over a given time window by the 8192 accumulators at node 607. The sums represent the signal energy over that time period. The processing gain for each bubble is preferably calculated at node 608 by dividing the energy of each bubble by the energy of an ideal unfocused signal 622. The unfocused signal energy is preferably calculated by summing at 619 the energies of the signals from each microphone element 618 over the given time window, weighted by the maximum ratio combining weight squared. This is the energy that would be expected if all of the signals were uncorrelated. The processing gain 608 is preferably calculated for each bubble by dividing the microphone array signal energy by the unfocused signal energy 622.

Processing Gain is achieved because signals from a common sound source all experience the same delay before being combined which results in those signals being added up coherently, meaning that their amplitudes add up. If 12 equal amplitude and time aligned direct signals 601 are combined the resulting signal will have an amplitude 12× higher, or a power level 144× higher. Signals from different sources and signals from the same source with significantly different delays, as the signals from reverb and noise do not add up coherently and do not experience the same gain. In the extremes, the signals are completely uncorrelated and will add up orthogonally. If 12 equal amplitude orthogonal signals are added up, the signal will have roughly 12× the power of the original signal or a 3.4× increase in amplitude (measured as rms). The difference between the 12× gain of the direct signal 601 and the 3.4× gain of the reverb and noise signals is the net processing gain (3.4 or 11 dB) of the microphone array when it is focused on the sound source 107. This makes the signal sound as if you have moved the microphone 608 3.4× closer to the sound source. This example uses a 12 microphone array but it could be extended to an arbitrary number (N) resulting in a maximum possible processing gain of sqrt(N) or 10 log (N) dB.

The bubble processor system preferably simultaneously focuses the microphone array 111 on 8192 points in 3-D space using the method described above. The energy level of a short burst of sound signal (50-100 ms) is measured at each of the 8192 virtual microphone bubble points and compared to the energy level that would be expected if the signals combined orthogonally. This gives the processing gain 608 at each point. The virtual microphone bubble that is closest to the sound source should experience the highest processing gain and be represented as a peak in the output. Once determined, the location is known.

Node 606 searches through the output of the processing gain unit 608 for the bubble with the highest processing gain. The (x,y,z) location 301120 of the virtual microphone corresponding to that bubble can then be determined by looking up the index in the original configuration to determine the exact location of the sound source. The parameters 614 maybe communicated to various electronic devices to steer and focus them to the identified sound source position.

After deriving the location of the sound source, focusing the microphone array on that sound source can be accomplished after achieving the gain. The bubble processor is preferably designed to find the sound source quickly enough so that the microphone array can be focused while the sound source is active, which can be a very short window of opportunity. The bubble processor system is preferably able to find new sound sources in less than 100 ms. Once found, the microphone array focuses on that location to pick up the sound source signal and the system reports the location of the sound through the Identify Source Signal Position 306 to other internal processes and to the host computer, so that it can implement sound sourced location based applications.

The embodiments described in this application have been presented with respect to use in one or more conference rooms preferably with multi users. However, the present invention may also find applicability in other environments such as: 1. Commercial transit passenger and crew cabins such as, but not limited to, aircraft, busses, trains and boats. All of these commercial applications can be outfitted with microphones and can benefit from consist desired source volume and control of the ambient sound conditions which can vary from moderate to considerable; 2. Private transportation such as cars, truck, and mini vans, where command and control applications and voice communication applications are becoming more prominent; 3. Industrial applications such as manufacturing floors, warehouses, hospitals, and retail outlets to allow for audio monitoring and to facilitate employee communications without having to use specific portable devices; and 4. Drive through windows and similar applications, where ambient sounds levels can be quite high and variable, can be controlled to consistent levels within the scope of the invention. Also, the processing described above may be carried out in one or more devices, one or more servers, cloud servers, etc.

The individual components shown in outline or designated by blocks in the attached Drawings are all well-known in the electronic processing arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of automatic gain control utilizing sound source position information in a shared space having a plurality of microphones and a plurality of sound sources, comprising:

receiving combined sound signals from the plurality of microphones;

locating, using one or more processors, position information corresponding to each of the plurality of sound sources in the shared space;

determining, using the one or more processors, the distance to each of the plurality of sound sources from each of the plurality of the microphones in the shared space, based on the position information;

defining, using the one or more processors, a predetermined gain weight adjustment for each of the plurality of microphones, based on the distance information;

applying the defined plurality of gain weight adjustments to the plurality of microphones in order to control the gain of a desired plurality of sound sources in the shared space;

maintaining, using the one or more processors, a substantially constant ambient sound level regardless of the position of the plurality of sound sources and the applied gain weight adjustments to the plurality of microphones, based on the received signals from the plurality of microphones; and outputting, using the one or more processors, a summed signal of the plurality of sound sources at a derived gain with a constant ambient sound level across the plurality of sound source positions in the shared space.

2. The method according to claim 1, wherein the one or more processor defines a zone between a configurable threshold distance and a minimum threshold distance, and wherein, when at least one of the plurality of sound sources is within said zone, the one or more processor (i) receives output from at least two microphones and (ii) reduces an output from at least one microphone.

3. The method according to claim 2, wherein, when at least one of the plurality of sound sources is inside said minimum threshold distance, the one or more processor (i) receives output from a microphone and (ii) reduces an output from at least one microphone.

4. The method according to claim 2, wherein, when at least one of the plurality of sound sources is outside said configurable threshold distance, the one or more processor receives output from all of the plurality of microphones.

5. The method according to claim 1, wherein the plurality of microphones are disposed in a 2D array.

6. The method according to claim 1, wherein the plurality of microphones are disposed in a 3D array.

7. The method according to claim 1, wherein the one or more processors comprises at least one position processor and at least one channel processor.

8. The method according to claim 7, wherein the at least one channel processor calculates delays in the plurality of microphones using positional information from the position processor.

9. The method according to claim 7, wherein the at least one channel processor comprises, for each channel, a channel multiplier and a channel delay.

10. The method according to claim 7, wherein the at least one position processor determines a coordinate (x,y,z) location of at least one of the plurality of sound sources by a highest processing gain.

11. The method according to claim 10, wherein said processing gain is determined by how much the plurality of microphones boosts a desired signal source relative to undesired signal sources.

12. Program code embodied in a non-transitory computer readable medium for automatic gain control utilizing sound source position information in a shared space having a plurality of microphones and a plurality of sound sources, said program comprising instructions causing at least one processor to:
 receive combined sound signals from the plurality of microphones;
 locate, using one or more processors, position information corresponding to each of the plurality of sound sources in the shared space;
 determine, using the one or more processors, the distance to each of the plurality of sound sources from each of the plurality of the microphones in the shared space, based on the position information;
 define, using the one or more processors, a predetermined gain weight adjustment for each of the plurality of microphones, based on the distance information;
 apply the defined plurality of gain weight adjustments to the plurality of microphones in order to control the gain of the desired plurality of sound sources in the shared space;
 maintain, using the one or more processors, a substantially constant ambient sound level regardless of the position of the plurality of sound sources and the applied gain weight adjustments to the plurality of microphones, based on the received signals from the plurality of microphones; and
 output, using the one or more processors, a summed signal of the plurality of sound sources at a derived gain with a constant ambient sound level across the plurality of sound source positions in the shared space.

* * * * *